(12) United States Patent
Maurere et al.

(10) Patent No.: US 12,726,203 B2
(45) Date of Patent: Sep. 1, 2026

(54) COMPUTATIONAL UNIT OF A CONFIGURABLE INTEGRATED UNIT INTENDED TO IMPROVE THE MANAGEMENT OF A DATA FLOW

(71) Applicant: Airbus Operations SAS, Toulouse (FR)

(72) Inventors: Pascal Maurere, Toulouse (FR); Anthony Caldeira, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 190 days.

(21) Appl. No.: 18/618,170

(22) Filed: Mar. 27, 2024

(65) Prior Publication Data

US 2024/0333290 A1 Oct. 3, 2024

(30) Foreign Application Priority Data

Mar. 30, 2023 (FR) ...................................... 2303108

(51) Int. Cl.
*H03K 19/17764* (2020.01)
*H03K 19/17756* (2020.01)

(52) U.S. Cl.
CPC . *H03K 19/17764* (2013.01); *H03K 19/17756* (2013.01)

(58) Field of Classification Search
None
See application file for complete search history.

(56) References Cited

U.S. PATENT DOCUMENTS

2006/0206696 A1* 9/2006 Saito .................. G06F 15/7867 712/227
2008/0079459 A1* 4/2008 Kawano ................. G06F 30/34 326/38
2009/0224799 A1 9/2009 Ogawa
2011/0246747 A1* 10/2011 Hanai .................. G06F 9/3897 712/E9.002
2019/0205286 A1* 7/2019 Tan .......................... G06F 5/10

OTHER PUBLICATIONS

French Search Report for corresponding French Patent Application No. 2303108 dated Nov. 28, 2023.

* cited by examiner

*Primary Examiner* — Jany Richardson
(74) *Attorney, Agent, or Firm* — Greer, Burns & Crain, Ltd.

(57) ABSTRACT

A computational unit of a configurable integrated circuit includes an input receiving data, an output and a core which is configured to execute an operation on the basis of at least one datum in order to obtain a result, and transmit the result to the output. The unit further includes a memory of first in, first out type associated with each input and configured to store each datum received by the input. The unit triggers the storage of a datum when a validity signal of a predefined value is detected, transmits, to the core, a stored datum and triggers an execution of the operation when a datum is stored in each memory and when no execution of the operation is in progress. The unit transmits, to the output, a validity signal of the predefined value at the same time as each transmitted result, and a different one otherwise.

9 Claims, 4 Drawing Sheets

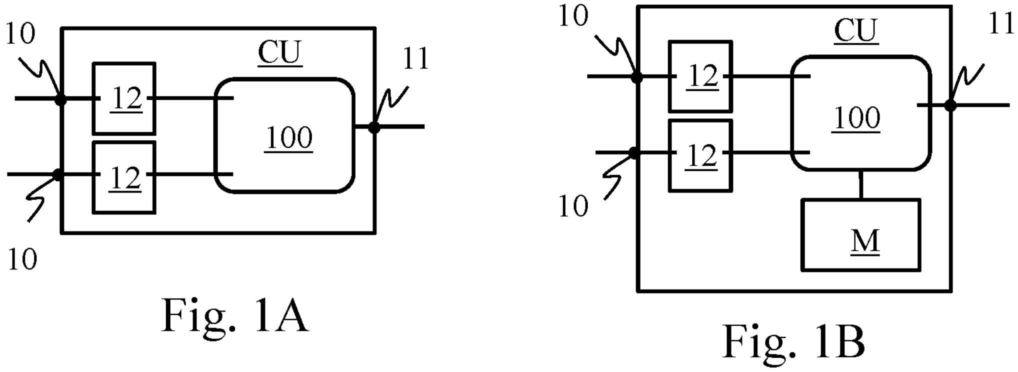
Fig. 1A
Fig. 1B
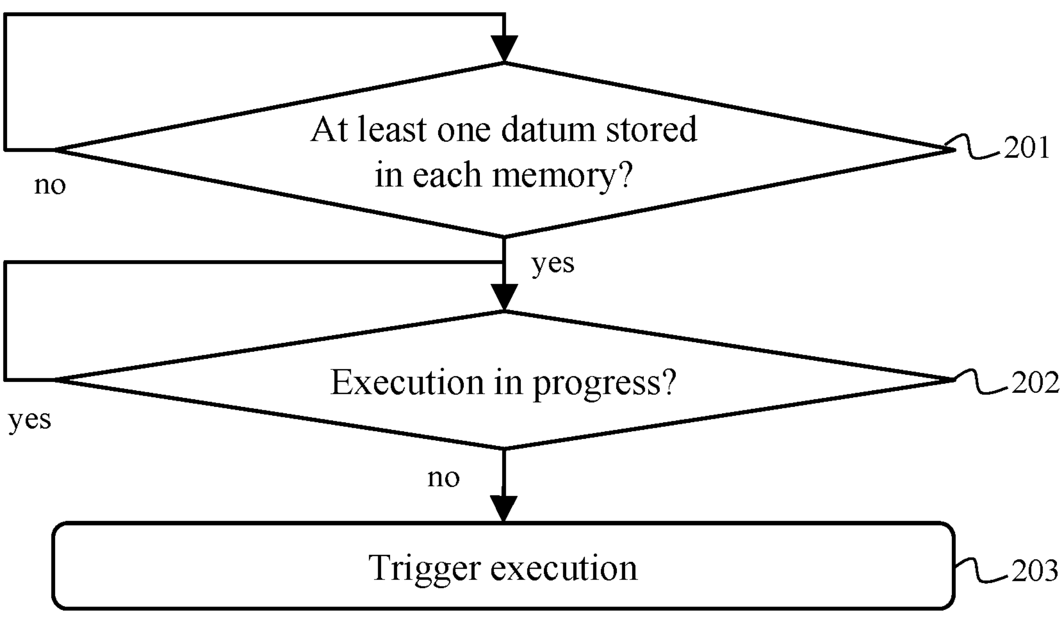
Fig. 2A

COMPUTATIONAL UNIT OF A CONFIGURABLE INTEGRATED UNIT INTENDED TO IMPROVE THE MANAGEMENT OF A DATA FLOW

CROSS-REFERENCES TO RELATED APPLICATIONS

This application claims the benefit of the French patent application No. 2303108 filed on Mar. 30, 2023, the entire disclosures of which are incorporated herein by way of reference.

FIELD OF THE INVENTION

The present invention relates to the field of configurable integrated circuits and relates, more particularly, to a computational unit of such a configurable integrated circuit.

BACKGROUND OF THE INVENTION

Configurable or programmable integrated circuits, such as FPGAs (field-programmable gate arrays), are used more and more to perform complex computations and notably for signal processing operations. In aeronautics, their low consumption with respect to microprocessors and their configurational flexibility make them particularly advantageous for designing avionic computers.

A complex computation is performed by a configurable integrated circuit by a data flow, in other words by a set of computational units. Each computational unit is capable of executing a predefined operation, such as a mathematical function, on the basis of one or more input data and of transmitting, as output, a result obtained by executing the predefined operation.

Furthermore, the computational units for the data flow are interconnected according to a predefined sequence. The term "predefined sequence" here means that the computational units are organized in a predefined manner and placed successively and/or in parallel with respect to one another. Thus, a result obtained by a computational unit is automatically transmitted to a following computational unit of the predefined sequence, the following computational unit then using the result as input datum. Furthermore, a computational unit of the predefined sequence may make use of several input data each originating from a distinct preceding computational unit at the same time, the preceding computational units being placed in parallel.

For example, two first computational units are placed in parallel with one another and immediately precede a third computational unit. According to this example, the results obtained by each of the first computational units are transmitted independently of one another to the third computational unit so that the predefined operation of the third computational unit is executed on the basis of the results used at the same time as input data.

The set of interconnected computational units for the data flow thus makes it possible to implement a complex operation composed of predefined operations according to the predefined sequence.

An important issue in the management of data flows relates to the stability of the input data. It is, indeed, necessary for an input datum not to vary, i.e., not to be replaced by another input datum, throughout the execution of the predefined operation by a computational unit. For example, for a first and a second computational unit which succeed one another in the order, if a result obtained by the first computational unit is transmitted to the second computational unit while the second computational unit is in the process of executing an operation, the input datum of the second computational unit varies, which risks generating an erroneous, for example false, abnormal or missing, result.

Moreover, when the predefined sequence of a data flow comprises computational units used in parallel, it is, furthermore, necessary to synchronize the various input data of a computational unit, in order to ensure the stability of all the input data at the same time, throughout the duration of the execution of the predefined operation.

A first solution is to insert a time offset between two successive computational units, for example with the aid of a shift register. Inserting such a time offset makes it possible to generate a delay between a computational unit obtaining a result and the following computational unit receiving it as input datum and therefore to manage the stability and the synchronization of the input data of the following computational unit. By calibrating the duration of this time offset appropriately, it is ensured that the expected input data are correctly placed at the input of the computational unit in question throughout the execution of the predefined operation which has to be performed on the basis of the input data. Such a solution is, nevertheless, costly in terms of resources while the resources available in a configurable integrated circuit are relatively limited.

A second solution is to define a trigger instant for the execution of the predefined operation of each computational unit. The trigger instant for a first computational unit is determined taking account of a subsequent instant at which an input datum is expected at the input of an immediately following computational unit and of the duration of the execution of the predefined operation of the first computational unit. When several first computational units are placed in parallel in the predefined sequence, the trigger instant for each of the first computational units is thus determined so that the results provided are received at the same time, as input data, at the input of the immediately following computational unit. The trigger instant for each computational unit of the predefined sequence may thus be predetermined step by step, for each computational unit, starting from the end of the predefined sequence. An orchestrator makes it possible to manage the predetermined trigger instants for each computational unit of the predefined sequence. The stability and the synchronization of the input data are thus managed by the successive triggerings, by the orchestrator, of the execution of the predefined operations of the computational units.

However, such solutions require a duration of the actual execution of each predefined operation of the computational units of the data flow to be determined in order to implement the inserted time offsets or the trigger instants precisely. The configuration of the data flow is then made more complex. Furthermore, the flexibility and ease of maintenance of the data flow are reduced in the event that one or more predefined operations and/or the predefined sequence are modified.

Moreover, none of the solutions makes it possible to optimize the use of a computation unit in terms of duration of use. Indeed, whether because of the insertion of time offsets or of the implementation of trigger instants, the computational units have to wait between two successive executions of a predefined operation, and are therefore not operated during such a wait.

It is then desirable to mitigate these drawbacks of the prior art.

It is notably desirable to provide a solution which makes it possible to configure a data flow for which the synchronization and the stabilization of the input data is easy to implement, flexible and easy to maintain. It is, furthermore, desirable to provide a solution which makes it possible to optimize hardware resources and notably to maximize the duration of use of a computational unit, while at the same time minimizing the actual duration of the complex operation implemented globally by the data flow.

SUMMARY OF THE INVENTION

One object of the present invention is to propose a computational unit of a configurable integrated circuit. The computational unit comprises: at least one input, configured to receive incident data; an output; a core located between the at least one input and the output and configured to execute a predefined operation on the basis of at least one input datum in order to obtain a result, and to transmit the obtained result to the output. The computational unit further comprises: a buffer memory of first in, first out type, referred to as a reception memory, associated with each input and configured to store each incident datum received by the input. The computational unit is configured to detect a validity signal received at the at least one input and trigger the storage, by the reception memory associated with the input in question, of an incident datum when the detected validity signal is equal to a predefined value, to transmit, to the core as input datum, a datum stored in each reception memory, and trigger an execution of the predefined operation when at least one datum is stored in each reception memory of the computational unit, and when, furthermore, no execution of the predefined operation is in progress and to transmit, to the output, a validity signal equal to the predefined value at the same time as each obtained result is transmitted, and transmit a validity signal different from the predefined value otherwise.

The stability and the synchronization of the input data are therefore managed easily and in an autonomous and independent manner for the computational unit. It is, furthermore, possible to process several data channels while at the same time optimizing the hardware resources used to implement a data flow. Having a buffer memory of first in, first out type associated with each input makes it possible to receive data flows totally independently and asynchronously at the various inputs of the computational unit, without risk of losing a datum received at an input.

According to one particular embodiment, the computational unit is further configured to associate an identifier with each transmitted result, the identifier being the identifier associated with the incident datum on the basis of which the transmitted result is obtained.

According to one particular embodiment, the computational unit is configured so that the identifier associated with each transmitted result is concatenated with the transmitted result.

According to one particular embodiment, the computational unit is further configured so that no execution of the predefined operation is in progress when an immediately preceding execution of the predefined operation is completed and when the result provided by the preceding execution is transmitted to the output.

According to one particular embodiment, the computational unit is configured so that the identifier associated with each incident datum is an identifier of a channel to which the incident datum belongs, a channel being a set of data which are used by a set of computational units to obtain the same final result on the basis of an initial set of data, and the identifier associated with each transmitted result is the identifier of the channel to which the result belongs.

The invention also relates to a configurable integrated circuit comprising a set of computational units in any one of the embodiments. The computational units are interconnected according to a predefined sequence so that, considering a first computational unit, the output of which is connected to an input of a second computational unit which follows the first computational unit according to the predefined sequence, the result and the validity signal transmitted by the core to the output of the first computational unit are automatically transmitted to the input of the second computational unit.

According to one particular embodiment, the connection between the output of a computational unit and the input of the following computational unit according to the predefined sequence is implemented by a communication bus configured to transmit the result in combination with an identifier and to transmit the validity signal.

The invention also relates to an aircraft comprising such a configurable integrated circuit.

The invention also relates to a method implemented by a computational unit of a configurable integrated circuit. The computational unit comprises: at least one input, configured to receive incident data; an output; a core located between the at least one input and the output and configured to execute a predefined operation on the basis of at least one input datum in order to obtain a result, and to transmit the obtained result to the output. The computational unit further comprises a buffer memory of first in, first out type, referred to as a reception memory, associated with each input and configured to store each incident datum received by the input. The method comprises the following steps, implemented by the computational unit: detecting a validity signal received at the at least one input and triggering the storage, by the reception memory associated with the input in question, of an incident datum when the detected validity signal is equal to a predefined value; transmitting, to the core as input datum, a datum stored in each reception memory, and triggering an execution of the predefined operation when at least one datum is stored in each reception memory of the computational unit, and when, furthermore, no execution of the predefined operation is in progress; and transmitting, to the output, a validity signal equal to the predefined value at the same time as each obtained result is transmitted, and transmitting a validity signal different from the predefined value otherwise.

BRIEF DESCRIPTION OF THE DRAWINGS

The above-mentioned features of the invention, as well as others, will become more clearly apparent on reading the following description of at least one example of an embodiment, the description being given in relation to the appended drawings, in which:

FIG. 1A schematically illustrates a computational unit of a configurable integrated circuit according to one particular embodiment;

FIG. 1B schematically illustrates a computational unit of a configurable integrated circuit according to another particular embodiment;

FIG. 2A schematically illustrates a first algorithm implemented by the computational unit;

DETAILED DESCRIPTION OF THE PREFERRED EMBODIMENTS

Figure 2B:
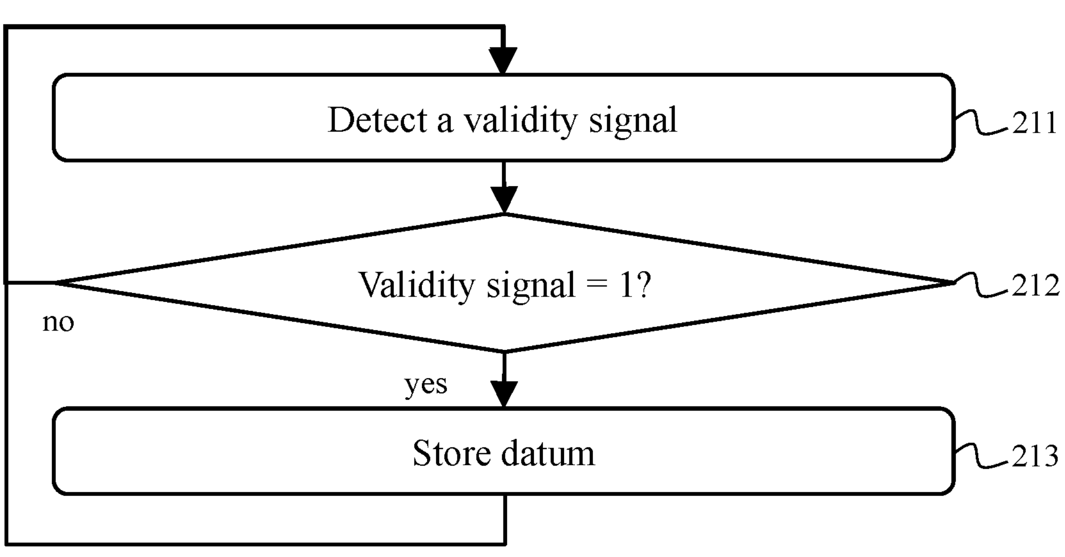
FIG. 2B schematically illustrates a second algorithm implemented by the computational unit.

FIG. 1A thus schematically illustrates a computational unit CU of a configurable integrated circuit, such as an FPGA (field-programmable gate array), a CPLD (complex programmable logic device) or an ASIC (application-specific integrated circuit), according to one particular embodiment.

The computational unit CU comprises a core 100 configured to execute (i.e., implement) a predefined operation, such as a computation or a mathematical function, on the basis of a set of input data so as to obtain a result. The core 100 is, for example, a logic circuit. According to another example, the core 100 is a microprocessor chip integrated into the configurable integrated circuit. The computational unit CU comprises at least one input 10 and an output 11. In the embodiment illustrated in FIG. 1A, the computational unit CU comprises two inputs 10.

The computational unit CU is configured to receive, at each input 10, incident data. Each execution of the predefined operation by the core 100 is carried out on the basis of a set of data comprising an input datum for each input 10. The computational unit CU is further configured to transmit, at the output 11, the obtained result.

The computational unit CU further comprises a buffer memory, referred to as a reception memory 12, associated with each input 10. Each reception memory 12 is configured to store any incident datum received by the associated input.

According to one embodiment, each incident datum is associated with an identifier. Preferably, the identifier makes it possible to identify a channel to which the incident datum belongs. A channel corresponds, in the computational unit CU, to the set of input data which is used with a view to obtaining the same result. According to one particular embodiment, each incident datum is received by the computational unit CU in the form of a single character string comprising a concatenation of the incident datum and of the associated identifier. In the expression “character string”, the term “character” is not limited to alphanumeric characters. It includes all types of data, be they of numeric type (according to any possible coding), alphanumeric type or any other type.

The computational unit CU comprises electronic circuitry, configured to detect a validity signal received at the input 10. The electronic circuitry is further configured to trigger the storage, by the reception memory 12, of an incident datum when the detected validity signal is equal to a predefined value. In other words, each reception memory 12 stores a new datum only when the detected validity signal is equal to the predefined value.

The electronic circuitry is further configured to transmit, to the output 11 and in parallel with each transmitted result, a validity signal equal to the predefined value at the same time as the result is transmitted. The electronic circuitry is further configured to modify the value of the validity signal after each result is transmitted, for example after a predetermined duration following the transmission of each result has elapsed, so as to transmit, to the output 11, a validity signal different from the predefined value. In other words, the transmitted validity signal has a value equal to the predefined value at the moment when the result is transmitted, the value being maintained during the predetermined duration, then the value of the validity signal is modified after the predetermined duration has elapsed. For example, the validity signal is a signal encoded on 1 bit and is fixed at 1 when a result is transmitted and fixed at zero otherwise.

According to one embodiment, the electronic circuitry is further configured to associate an identifier with each obtained result. The identifier associated with a result is the identifier of the channel to which the set of input data which made it possible to arrive at the result by executing the predefined operation belongs. In other words, the identifier associated with the result is the identifier associated with the incident datum on the basis of which the result is obtained. For this purpose, the computational unit CU captures the identifier associated with each received and stored incident datum and saves the identifier while the core 100 executes the predefined operation on the basis of the incident datum. When the execution of the predefined operation is completed, the computational unit CU then associates the captured identifier with the obtained result.

According to one particular embodiment, the computational unit CU associates an identifier with an obtained result by concatenating the obtained result and the identifier, so as to form a single character string.

The computational unit CU comprises electronic circuitry, configured to trigger, on two conditions, an execution of the predefined operation by the core 100, by retrieving a datum stored in the reception memory 12 of each input 10 and by transmitting each retrieved datum, as input datum, to the core 100.

The first condition is that no execution of the predefined operation should be in progress. Thus, when a new incident datum is received by an input 10 of the computational unit CU, the new incident datum is stored in the associated reception memory without causing the input datum used by the core to change. The stability of the input data which are used by the core 100 is thus guaranteed. Furthermore, when an execution of the predefined operation is completed, in other words when a result is obtained and transmitted to the output 11, a new input datum is transmitted from the reception memory 12 to the core 100 by the computational unit CU in order to automatically trigger a new execution of the predefined operation.

The second condition is that the reception memory 12 of each input 10 should comprise at least one stored datum. Thus, each computational unit CU can manage the synchronization of the data at its various inputs 10 in an autonomous manner. An execution of the predefined operation cannot therefore, for example, be triggered if an incident datum has been received at just one input 10 while the computational unit CU comprises two or more inputs. The synchronization of the input data is then guaranteed.

The triggering of an execution of the predefined operation according to the two conditions further makes it possible for the computational unit CU to execute the same predefined operation several times consecutively. In other words, no wait time is necessary between two successive executions of the predefined operation (e.g., two successive computations) in order to guarantee the stability and the synchronization of the input data to the computational unit CU, in so far as the set of input data which are necessary for executing the predefined operation are available (i.e., stored in the reception memory 12).

The computational unit CU can further carry out two successive executions of the predefined operation for two distinct channels. The computational unit CU is thus configured to manage a plurality of channels easily by processing them successively. The absence of wait times makes it possible to maximize the duration of use of the computational unit CU and thus makes it possible to optimize the use of hardware resources in a configurable integrated circuit.

Each reception memory 12 is a memory of FIFO (first in, first out) type. The incident data are stored then retrieved by the computational unit CU in the order in which the incident data are received at the associated input 10. Thus, when several incident data are received successively at the same input 10, the computational unit CU automatically selects the oldest received incident datum. Having a buffer memory of first in, first out type associated with each input makes it possible to receive data flows totally independently and asynchronously at the various inputs of the computational unit, without risk of losing a datum received at an input. In addition, when an output of a first computational unit is connected to an input of a second computational unit, the first computational unit can place, at its output, a result of a computation which it has performed from the end of the computation, without waiting for a time offset or the availability of the input of the second computational unit. Indeed, a buffer memory of first in, first out type being associated with the second input, this guarantees that the result of the computation can be received at any instant, totally independently of receiving other data at other input(s) of the second computational unit and totally independently of the availability of the second computational unit. Consequently, this makes it possible to reduce the latency times for the concatenation of a set of computations by various computational units which are interconnected in the integrated circuit.

FIG. 1B schematically illustrates a computational unit CU of a configurable integrated circuit according to another particular embodiment. According to the other particular embodiment, the computational unit CU comprises, besides the at least one input 10, the output 11, the core 100 and the at least one reception memory 12, at least one additional working memory M.

The additional working memory M makes it possible to store (i.e. record) input data used previously to execute the predefined operation and belonging to several distinct channels. Each input datum is recorded in combination with the identifier of the channel concerned. Thus, the core 100 of the computational unit can execute a more complex predefined operation, such as a convolution product, making use of data belonging to several channels, while at the same time easily managing a plurality of channels. For example, a convolution product executed by the core 100 of the computational unit CU makes use of data belonging to several channels as well as on coefficients. The coefficients are stored in the additional working memory M. Alternatively, the coefficients are stored in a second additional working memory (not depicted). The coefficients can be the same for each channel and are then constant. Alternatively, the coefficients depend on the channel for which the convolution product is executed.

FIG. 2A schematically illustrates a first algorithm implemented by the computational unit CU.

In a first step 201, the computational unit CU determines whether at least one datum is stored in each reception memory 12 of the computational unit CU. If this is the case, the computational unit CU moves to a step 202. Otherwise, the computational unit CU returns to the step 201.

In the step 202, the computational unit CU determines whether an execution of the predefined operation by the core 100 is in progress. If this is the case, the computational unit CU returns to the step 202 in order to wait for the execution in progress of the predefined operation to be completed. Otherwise, the computational unit CU moves to a step 203.

In the step 203, the computational unit CU triggers an execution of the predefined operation by the core 100. For this purpose, the computational unit CU retrieves a datum stored in each reception memory in order to transmit it to the core as input datum. According to one embodiment, transmitting the input datum to the core 100 automatically triggers the execution of the predefined operation.

The computational unit CU then returns to the step 201.

FIG. 2B schematically illustrates a second algorithm, implemented by the computational unit CU in parallel with the first algorithm.

In a first step 211, the computational unit CU detects a validity signal received at the input 10.

In a following step 212, the computational unit CU determines whether the detected validity signal is equal to the predefined value. If this is the case, a step 213 is carried out. Otherwise, the computational unit CU returns to the step 211.

In the step 213, the computational unit CU triggers the storage, by the reception memory 12, of the incident datum.

Figure 3A:
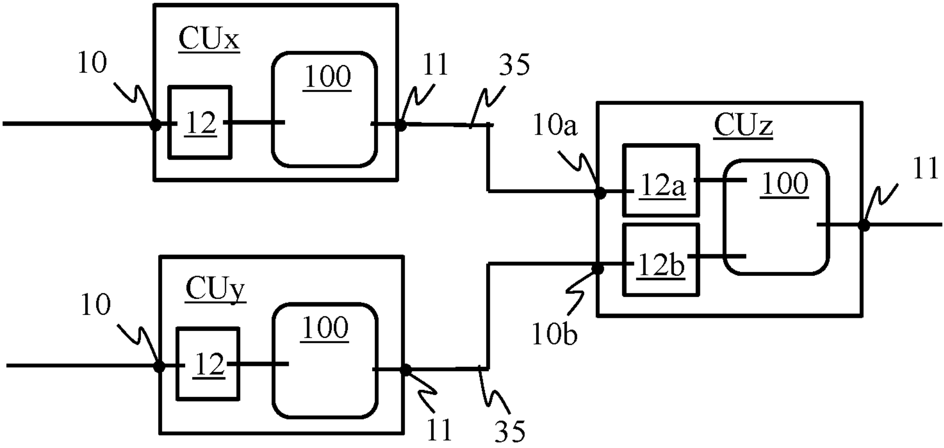
FIG. 3A schematically illustrates a data flow comprising a set of computational units, according to a first embodiment.

FIG. 3A schematically illustrates a data flow according to a first embodiment, comprising a set of computational units CUx, CUy, CUz of a configurable integrated circuit. The data flow makes it possible, on the basis of an initial set of data, to implement, or execute, a global operation in order to provide a final result.

The computational units CUx, CUy, CUz are interconnected and sequenced according to a predefined sequence, in other words organized in a predefined manner and placed successively and/or in parallel with one another. The result obtained by a computational unit CU, such as the computational unit CUx, is automatically transmitted to an input 10 of a following computational unit of the predefined sequence, such as the computational unit CUz, where the result is then processed as an incident datum by the following computational unit CU. The global operation implemented by the data flow is thus composed of each predefined operation of the data flow, according to the predefined sequence.

In the first embodiment, the data flow comprises a first computational unit CUx, comprising an input 10 and an output 11, a second computational unit CUy comprising an input 10 and an output 11 and a third computational unit CUz comprising a first input 10*a*, a second input 10*b* and an output 11. The core 100 of the first computational unit CUx is configured to execute a first predefined operation. Similarly, the core 100 of the second computational unit CUy or of the third computational unit CUz, respectively, is configured to execute a second or a third predefined operation, respectively. Each computational unit CUx, CUy, CUZ comprises a reception memory 12, 12*a*, 12*b* associated with each input 10, 10*a*, 10*b*.

The output 11 of the first computational unit CUx is connected, by a communication link 35, such as a communication bus, to the first input 10*a* of the third computational unit CUz. In other words, a result obtained by the core 100 of the first computational unit CUx is automatically sent, possibly in combination with an identifier of the channel to which the result belongs, to the first input 10*a* of the third computational unit CUz. Furthermore, the output 11 of the second computational unit CUy is connected, by a communication link 35, to the second input 10*b* of the third computational unit CUz. A result obtained by the core 100 of the second computational unit CUy is thus automatically sent to the second input 10*a* of the third computational unit CUz. According to one particular embodiment, each computational unit, such as the first or the second computational unit CUx, CUy, concatenates each obtained result with the identifier of the channel associated with the result, so as to form a character string. The communication link 35 transmits the character string thus formed to the following computational unit, such as the computational unit CUz, of the predefined sequence.

Each computational unit CUx, CUy, CUz of the data flow is configured to manage several channels. A channel groups together all of the data used by the computational units CUx, CUy, CUz of the data flow in order to obtain, on the basis of an initial set of data, a final result, by executing the global operation. In other words, a channel corresponds to an execution of the global operation. An identifier of a channel is an identifier of an execution of a global operation.

In one example of an implementation, the input 10 of the computational unit CUx is connected to at least one first information source configured to provide it with data originating from at least one first sensor, for example a sensor of an aircraft in which the integrated circuit is installed. Likewise, the input 10 of the computational unit CUy is connected to at least one second information source configured to provide it with data originating from at least one second sensor of the aircraft. The computational units CUx, CUy and CUz are configured to execute at least one first global operation for a first channel and one second global operation for a second channel. The first global operation, corresponding to the first channel, uses data originating from a first sensor CIA at the input of the computational unit CUx and data originating from a second sensor C2A at the input of the computational unit CUy. An identifier of the first channel is associated with the data originating from the sensor CIA which are received at the input of the computational unit CUx, as well as with the data originating from the sensor C2A which are received at the input of the computational unit CUy. The identifier of the first channel is also associated with the results computed by the computational units CUx and CUy on the basis of the input data (originating from the sensors C1A and C2A, respectively). These results and the associated identifier corresponding to the first channel are transmitted to the computational unit CUz by communication links 35. The computational unit CUz consequently computes a global result with which it also associates the identifier corresponding to the first channel. The second global operation, corresponding to the second channel, uses data originating from another first sensor C1B at the input of the computational unit CUx and data originating from another second sensor C2B at the input of the computational unit CUy. An identifier of the second channel is associated with the data originating from the sensor C1B which are received at the input of the computational unit CUx, as well as with the data originating from the sensor C2B which are received at the input of the computational unit CUy. The identifier of the second channel is also associated with the results computed by the computational units CUx and CUy on the basis of the input data (originating from the sensors C1B and C2B, respectively). These results and the associated identifier corresponding to the second channel are transmitted to the computational unit CUz by the communication links 35. The computational unit CUZ consequently computes a global result with which it also associates the identifier corresponding to the second channel. Using the same computational units CUx, CUy and CUz to execute the first global operation and to execute the second global operation makes it possible to reduce the number of computational units of the integrated circuit and therefore to optimize resources.

Since each computational unit CUx, CUy, CUz is capable of managing, in an autonomous and independent manner, the stability and the synchronization of its input data, managing the data flow is thereby made easier, both when the configurable integrated circuit is being configured and in the event that at least one computational unit CUx, CUy, CUz and/or the predefined sequence evolves. The evolution of a computational unit CUx, CUy, CUz may, for example, imply variation in an actual duration of the execution of the predefined operation of the computational unit CUx, CUy, CUz.

Furthermore, since no wait time is necessary between two executions of the predefined operation of each computational unit CUx, CUy, CUz, it is easy to reduce the duration of the execution of the global operation of the data flow, or to reduce the number of computational units CU (in other words, of hardware resources) used to execute the global operation with an equal duration. Likewise, the number of channels which are processed can be increased with an equal duration and with an equal number of computational units used.

Figure 3B:
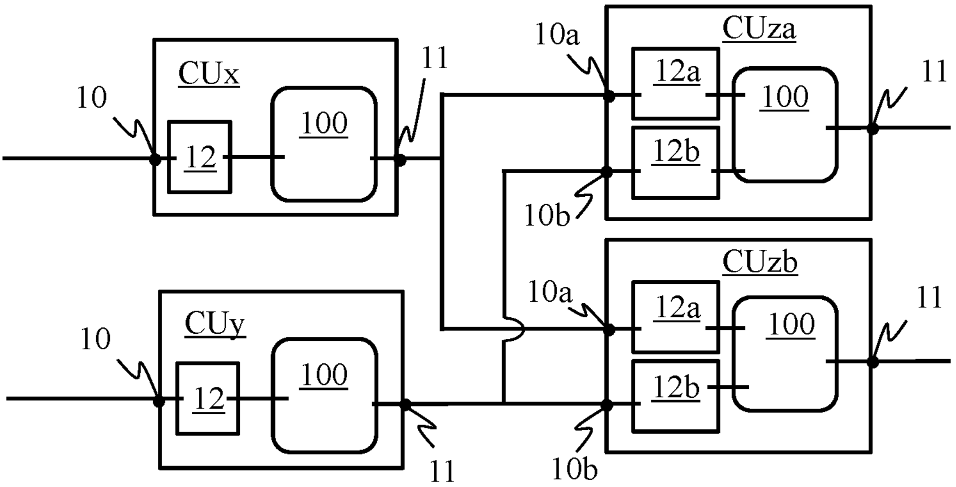
FIG. 3B schematically illustrates a data flow comprising a set of computational units, according to a second embodiment.

FIG. 3B schematically illustrates a data flow according to a second embodiment, comprising a set of computational units CUx, CUy, CUza and CUzb. In the second embodiment, the data flow comprises the first and the second computational unit CUx and CUy. The third computational unit CUz described in the embodiment of FIG. 3A is duplicated, in the second embodiment, into an identical third computational unit CUza and fourth computational unit CUzb.

The output 11 of the first computational unit CUx is connected to the first input 10*a* of the third computational unit CUza and to the first input 10*a* of the fourth computational unit CUzb. Furthermore, the output 11 of the second computational unit CUy is connected to the second input 10*b* of the third computational unit CUza and to the second input 10*b* of the fourth computational unit CUzb. Thus, a result obtained by the core 100 of the first computational unit CUx is automatically sent to the first input 10*a* of the third computational unit CUza and/or to the first input 10*a* of the fourth computational unit CUzb. A result obtained by the core 100 of the second computational unit CUy is thus automatically sent to the second input 10*b* of the third computational unit CUza and/or to the second input 10*b* of the fourth computational unit CUzb.

According to one example of an embodiment, each result obtained by the core 100 of the first computational unit CUx is sent either to the first input 10*a* of the third computational unit CUza or to the first input 10*a* of the fourth computational unit CUzb depending on the identifier associated with the result. For example, a demultiplexer is placed after the output 11 of the first computational unit CUx and comprises a mapping table associating, with each identifier, a computational unit CUza or CUzb from among the third and the fourth computational units CUza, CUzb. The demultiplexer determines the identifier associated with each result received from the first computational unit CUx and deduces therefrom, with the aid of the mapping table, whether the result has to be transmitted to the third computational unit CUza or to the fourth computational unit CUzb. A similar demultiplexer is placed after the output 11 of the second computational unit CUy.

Figure 4:
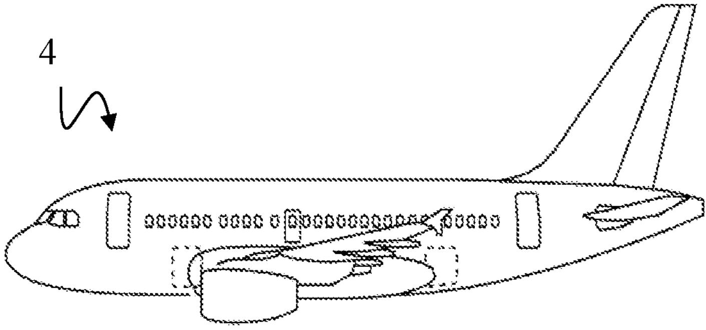
FIG. 4 schematically illustrates an aircraft comprising a configurable integrated circuit.

FIG. 4 schematically illustrates an aircraft 4 comprising at least one configurable integrated circuit comprising a set of computational units CU.

Figure 5:
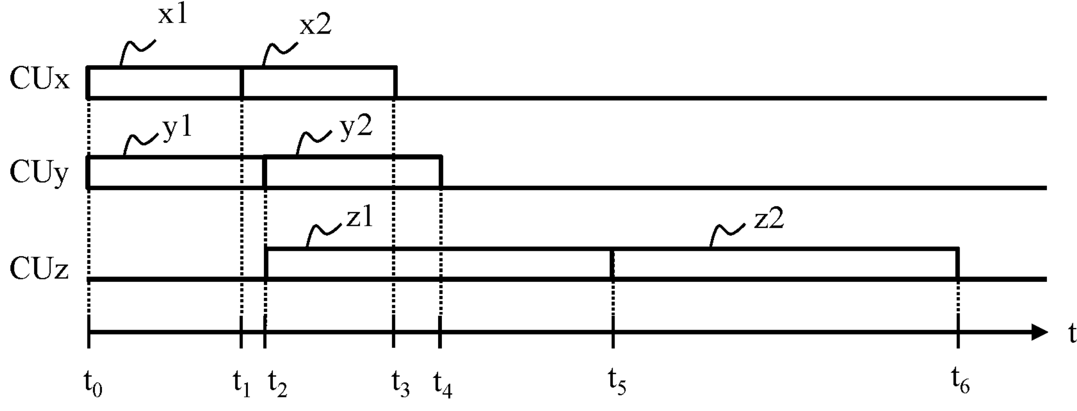
FIG. 5 schematically illustrates a first example of a timing diagram depicting the execution of a global operation by the data flow of the first embodiment.

FIG. 5 schematically illustrates a first example of a timing diagram depicting the execution of a global operation for a first channel and a second channel, by the data flow of the first embodiment.

The first predefined operation, the second predefined operation and the third predefined operation each have a specific actual duration of execution. In the first example of a timing diagram, the actual duration of the execution of the first predefined operation is less than the actual duration of the execution of the second predefined operation, which is itself less than the actual duration of the execution of the third predefined operation.

At the start of the timing diagram, in other words at an initial instant 10, the reception memory 12 of the first computational unit CUx is considered to comprise an input datum belonging to the first channel and an input datum belonging to the second channel. Furthermore, the reception memory 12 of the second computational unit CUy is considered to comprise an input datum belonging to the first channel and an input datum belonging to the second channel.

At the initial instant 10, the first computational unit CUx retrieves, from the reception memory 12 associated with its input 10, an input datum belonging to the first channel and triggers a first execution x1 of the first predefined operation. Furthermore, the second computational unit CUy retrieves, from the reception memory 12 associated with its input 10, an input datum of the first channel and triggers a first execution y1 of the second predefined operation.

At an instant t1, the first computational unit CUx completes the first execution x1 of the first predefined operation and transmits the result thus obtained, possibly in combination with an identifier of the first channel, to the third computational unit CUz. The first computational unit CUx then assigns the predefined value to a validity signal and transmits the validity signal in parallel with and at the same time as transmitting the result. The third computational unit CUz then detects that the validity signal received at its first input 10*a* is equal to the predefined value. The reception memory 12*a* associated with the first input 10*a* of the third computational unit CUz then stores the result, belonging to the first channel. Furthermore, the first computational unit CUx retrieves, from the reception memory 12 associated with its input 10, the input datum belonging to the second channel and triggers a second execution x2 of the first predefined operation.

At an instant t2, the second computational unit CUy completes the first execution y1 of the second predefined operation and transmits the result thus obtained, possibly in combination with the identifier of the first channel, to the second input 10*b* of the third computational unit CUz. The second computational unit CUy then assigns the predefined value to a validity signal and transmits the validity signal in parallel with and at the same time as transmitting the result. The third computational unit CUz then detects that the validity signal received at its second input 10*b* is equal to the predefined value. The reception memory 12 associated with the second input 10*b* then stores the result, which belongs to the first channel. Furthermore, the second computational unit CUy retrieves, from the reception memory 12 associated with its input 10, an input datum of the second channel and triggers a second execution y2 of the second predefined operation.

At the instant t2, the third computational unit CUz determines that each reception memory 12*a*, 12*b* comprises a stored datum. Furthermore, no execution of the third predefined operation by the third computational unit CUz is in progress. The third computational unit therefore triggers a first execution of the third predefined operation z1 for data which are associated with the first channel.

At an instant t3, the first computational unit CUx completes the second execution x2 of the first predefined operation and transmits the result thus obtained, possibly in combination with an identifier of the second channel, to the third computational unit CUz. The first computational unit CUx then assigns the predefined value to a validity signal and transmits the validity signal in parallel with and at the same time as transmitting the result. The third computational unit CUz then detects that the validity signal received at its first input 10*a* is equal to the predefined value. The reception memory 12*a* associated with the first input 10*a* of the third computational unit CUz then stores the result, which belongs to the second channel. The first computational unit CUx then determines that no datum is stored in its reception memory 12 and starts waiting for a new incident datum.

At an instant 14, the second computational unit CUy completes the second execution y2 of the second predefined operation and transmits the result thus obtained, possibly in combination with the identifier of the second channel, to the second input 10*b* of the third computational unit CUz. The second computational unit CUy then assigns the predefined value to a validity signal and transmits the validity signal in parallel with and at the same time as transmitting the result. The third computational unit CUz then detects that the validity signal received at its second input 10*b* is equal to the predefined value. The reception memory 12*b* then stores the result, which belongs to the second channel. The third computational unit CUz determines that each reception memory 12*a*, 12*b* associated with one of its inputs 10*a*, 10*b* comprises a stored datum. However, the first execution z1 of the third predefined operation being in progress, the third computational unit CUZ does not trigger a new execution of the third predefined operation and starts waiting for the end of the first execution z1 of the third predefined operation.

At an instant t5, the third computational unit CUz completes the first execution z1 of the third predefined operation. The third computational unit CUZ thus obtains the result of the global operation associated with the first channel and provides the result, associating it with the identifier of the first channel. Furthermore, the third computational unit CUz retrieves, from each reception memory 12*a*, 12*b*, input data of the second channel and then triggers a second execution z2 of the third predefined operation.

At an instant 16, the third computational unit CUz completes the second execution z2 of the third predefined operation, obtains the result of the global operation associated with the second channel and provides the result, associating it with the identifier of the second channel.

Figure 6:
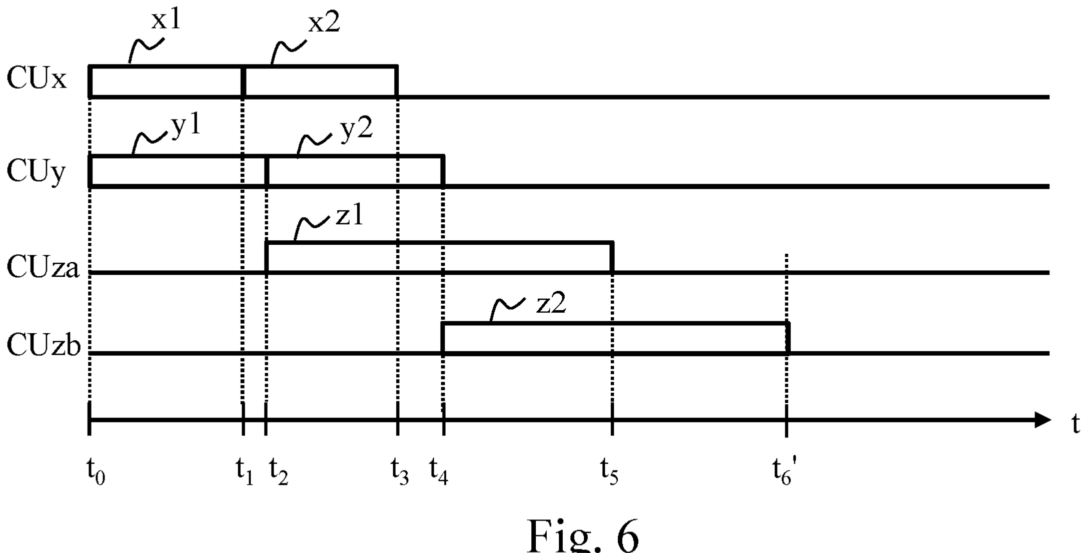
FIG. 6 schematically illustrates a second example of a timing diagram depicting the execution of a global operation by the data flow of the second embodiment.

FIG. 6 schematically illustrates a second example of a timing diagram depicting the execution of a global operation for a first channel and a second channel, by the data flow of the second embodiment.

According to the second example, the actual durations of the execution of the first, second and third predefined operations are the same as in the first example of a timing diagram, described in FIG. 5. The third predefined operation can be executed selectively by the third computational unit CUza and by the fourth computational unit CUzb.

Similarly to the first example of a timing diagram, at the initial instant t0, the reception memory 12 of the first computational unit CUx is considered to comprise input data belonging to the first and to the second channel, and the reception memory 12 of the second computational unit CUy is considered to comprise input data belonging to the first and to the second channel.

At the instant 10, similarly to what is described in FIG. 5, a first execution of the first predefined operation is triggered by the first computational unit CUx and a first execution of the second predefined operation is triggered by the second computational unit CUy, for data belonging to the first channel.

At the instant t1, the first computational unit CUx completes the first execution x1 of the first predefined operation and transmits the result thus obtained, possibly in combination with the identifier of the first channel, to the first input 10*a* of the third computational unit CUza, at the same time as a validity signal equal to the predefined value. The validity signal equal to the predefined value is detected by the first input 10*a* of the third computational unit CUza and the result is then stored in the reception memory 12*a* of the third computational unit CUza.

The first computational unit CUx further triggers a second execution x2 of the first predefined operation for data belonging to the second channel.

At the instant t2, the second computational unit CUy completes the first execution y1 of the second predefined operation and transmits the result thus obtained, possibly in combination with the identifier of the first channel, to the second input 10*b* of the third computational unit CUza, at the same time as a validity signal equal to the predefined value. The validity signal equal to the predefined value is detected by the second input 10*b* of the third computational unit CUza and the result is then stored in the reception memory 12*b* of the third computational unit CUza.

The third computational unit CUza then triggers a first execution z1 of the third predefined operation for data belonging to the first channel, on the basis of the data stored in the reception memories 12*a* and 12*b* of the third computational unit CUza.

The second computational unit CUy further triggers a second execution y2 of the second predefined operation on the basis of an input datum of the second channel.

At the instant t3, the first computational unit CUx completes the second execution x2 of the first predefined operation and transmits the result thus obtained, possibly in combination with the identifier of the second channel, to the first input 10*a* of the fourth computational unit CUzb, at the same time as a validity signal equal to the predefined value. The validity signal equal to the predefined value is detected by the first input 10*a* of the fourth computational unit CUzb and the result is stored in the reception memory 12*a* of the fourth computational unit CUzb.

At the instant t4, the second computational unit CUy completes the second execution y2 of the second predefined operation and transmits the result thus obtained, possibly in combination with the identifier of the second channel, to the second input 10*b* of the fourth computational unit CUzb, at the same time as a validity signal equal to the predefined value. The validity signal equal to the predefined value is detected by the second input 10*b* of the fourth computational unit CUzb and the result is stored in the reception memory 12*b* of the fourth computational unit CUzb.

Furthermore, the fourth computational unit CUzb triggers a second execution z2 of the third predefined operation for data belonging to the second channel, on the basis of the data stored in the reception memories 12*a* and 12*b* of the fourth computational unit CUzb.

At the instant t5, the third computational unit CUza obtains the result of the global operation belonging to the first channel and provides the result, associating it with the identifier of the first channel.

At an instant t6', the fourth computational unit CUzb obtains the result of the global operation belonging to the second channel and provides the result, associating it with the identifier of the second channel.

The instant t6' falls earlier than the instant t6 described in FIG. 5 by virtue of the duplication of the third computational unit CUz into an identical third and fourth computational unit CUza and CUzb. It is thus possible to minimize the duration of the execution of the global operation for several channels.

In the first and the second example of a timing diagram, each computational unit CUx, CUy, CUz, CUza, CUzb is available again to execute its predefined operation as soon as a result belonging to the second channel is obtained, and can then be used for other channels, for example. Thus, the computational unit CUx is available from the instant t3, the computational unit CUy is available from the instant t4 and the computational unit CUz is available from the instant t6 while the computational unit CUza is available from the instant t5 and the computational unit CUz is available from the instant $t_6$'.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A configurable integrated circuit comprising a set of computational units, each computational unit comprising:

at least one input configured to receive incident data, an output, a core located between the at least one input and the output and configured to execute a predefined operation based on at least one input datum in order to obtain a result, and to transmit the obtained result to the output, a buffer memory of first in, first out type, referred to as a reception memory, associated with each input and configured to store each incident datum received by said input, wherein each computational unit is configured to:

detect a validity signal received at said at least one input and trigger storage, by the reception memory associated with the input in question, of an incident datum when the detected validity signal is equal to a predefined value, transmit, to the core as input datum, a datum stored in each reception memory, and trigger an execution of the predefined operation when at least one datum is stored in each reception memory of the computational unit, and when, furthermore, no execution of the predefined operation is in progress, transmit, to the output, a validity signal equal to the predefined value at the same time as each obtained result is transmitted, and transmit a validity signal different from the predefined value otherwise, associate an identifier with each transmitted result, the identifier associated with each transmitted result is concatenated with the transmitted result, said identifier being an identifier associated with the incident datum, said transmitted result being obtained based on the incident datum, the identifier associated with each incident datum is an identifier of a channel to which said incident datum belongs, the channel being a set of data which are used by the set of computational units to obtain the same final result based on an initial set of data, and the identifier associated with each transmitted result is the identifier of the channel to which the result belongs, wherein each computational unit of the set of computational units being interconnected according to a predefined sequence, so that, considering a first of the computational units, the output of which is connected to an input of a second of the computational units which follows the first computational unit according to the predefined sequence, the result and the validity signal transmitted by the core to the output of the first computational unit being automatically transmitted to the input of the second computational unit, and perform, via each aforementioned computational unit of the set of computational units, two successive executions of the predefined operation for two distinct channels without any waiting time.

2. The configurable integrated circuit according to claim 1, further configured so that no execution of the predefined operation is in progress when an immediately preceding execution of the predefined operation is completed and when the result provided by said preceding execution is transmitted to the output.

3. The configurable integrated circuit according to claim 1, wherein a connection between the output of a computational unit and the input of a following computational unit according to the predefined sequence is implemented by a communication bus configured to transmit the result in combination with an identifier and to transmit the validity signal.

4. An aircraft comprising the configurable integrated circuit according to claim 3.

5. The configurable integrated circuit according to claim 1, wherein at least one computational unit of the set of computational units is connected to and configured to receive originating data from at least one sensor.

6. The configurable integrated circuit according to claim 5, wherein the at least one sensor is installed on an aircraft and configured to provide measurements pertaining to the aircraft.

7. A method implemented by a configurable integrated circuit comprising a set of computational units, each computational unit comprising:

at least one input configured to receive incident data, an output, a core located between the at least one input and the output and configured to execute a predefined operation based on at least one input datum in order to obtain a result, and to transmit the obtained result to the output, a buffer memory of first in, first out type, referred to as a reception memory, associated with each input and configured to store each incident datum received by said input, the method comprises the following steps, which are implemented by each computational unit:

detecting a validity signal received at said at least one input and triggering storage, by the reception memory associated with the input in question, of an incident datum when the detected validity signal is equal to a predefined value, transmitting, to the core as input datum, a datum stored in each reception memory, and trigger an execution of the predefined operation when at least one datum is stored in each reception memory of the computational unit, and when, furthermore, no execution of the predefined operation is in progress, transmitting, to the output, a validity signal equal to the predefined value at the same time as each obtained result is transmitted, and transmitting a validity signal different from the predefined value otherwise, associating an identifier with each transmitted result, the identifier associated with each transmitted result is concatenated with the transmitted result, said identifier being an identifier associated with the incident datum, said transmitted result being obtained based on the incident datum, the identifier associated with each incident datum is an identifier of a channel to which said incident datum belongs, the channel being a set of data which are used by the set of computational units to obtain the same final result based on an initial set of data, and the identifier associated with each transmitted result is the identifier of the channel to which the result belongs, wherein each computational unit of the set of computational units being interconnected according to a predefined sequence, so that, considering a first of the computational units, the output of which is connected to an input of a second of the computational units which follows the first computational unit according to the predefined sequence, the result and the validity signal transmitted by the core to the output of the first computational unit being automatically transmitted to the input of the second computational unit, and performing, via each aforementioned computational unit of the set of computational units, two successive executions of the predefined operation for two distinct channels without any waiting time.

8. The method according to claim 7, further including receiving, from at least one sensor, by at least one computational unit of the set of computational units, originating data.

9. The method according to claim 8, wherein the at least one sensor is installed on an aircraft and configured to provide measurements pertaining to the aircraft.

* * * * *